(12) United States Patent
Fukuda et al.

(10) Patent No.: US 8,298,873 B2
(45) Date of Patent: Oct. 30, 2012

(54) METHOD FOR PRODUCING CIRCUIT SUBSTRATE, AND CIRCUIT SUBSTRATE

(75) Inventors: Tatsuo Fukuda, Itabashi-ku (JP); Masahito Nakabayashi, Itabashi-ku (JP); Naofumi Izumi, Itabashi-ku (JP)

(73) Assignee: Lintec Corporation, Tokyo (JP)

( * ) Notice: Subject to any disclaimer, the term of this patent is extended or adjusted under 35 U.S.C. 154(b) by 637 days.

(21) Appl. No.: 12/523,805

(22) PCT Filed: Jan. 17, 2008

(86) PCT No.: PCT/JP2008/050478
§ 371 (c)(1),
(2), (4) Date: Jul. 20, 2009

(87) PCT Pub. No.: WO2008/087995
PCT Pub. Date: Jul. 24, 2008

(65) Prior Publication Data
US 2010/0044887 A1    Feb. 25, 2010

(30) Foreign Application Priority Data
Jan. 18, 2007 (JP) .................................. 2007-009568

(51) Int. Cl.
*H01L 21/16* (2006.01)
(52) U.S. Cl. . 438/125; 438/106; 438/126; 257/E21.503; 257/E23.116
(58) Field of Classification Search .................. 438/125, 438/126, 106; 257/782, E21.503, E23.116
See application file for complete search history.

(56) References Cited

U.S. PATENT DOCUMENTS

| | | | | |
|---|---|---|---|---|
| 5,972,807 A | * | 10/1999 | Tani et al. | ........................ 442/63 |
| 7,218,812 B2 | * | 5/2007 | Maxwell et al. | ................. 385/33 |
| 2005/0010880 A1 | | 1/2005 | Schubert et al. | |
| 2005/0045379 A1 | | 3/2005 | Sakurai et al. | |
| 2006/0263930 A1 | | 11/2006 | Ito | |
| 2007/0141760 A1 | * | 6/2007 | Ferguson et al. | ............. 438/127 |

FOREIGN PATENT DOCUMENTS

| | | |
|---|---|---|
| CN | 1825572 A | 8/2006 |
| JP | 2003-248436 A | 9/2003 |
| JP | 2005-079276 A | 3/2005 |
| JP | 2006-332094 A | 12/2006 |

* cited by examiner

*Primary Examiner* — Kenneth Parker
*Assistant Examiner* — Jose R Diaz
(74) *Attorney, Agent, or Firm* — Sughrue Mion, PLLC

(57) ABSTRACT

The method for producing a circuit substrate of the present invention is characterized in that the circuit substrate is produced using as sheet a circuit substrate sheet including an uncured layer a part of which, the part being other than a part at which a circuit chip is disposed, is selectively curable before or after disposal of said circuit chip, wherein the uncured layer has a softness that enables embedding of the circuit chip in the circuit substrate sheet upon pressing the circuit chip that has been disposed on a surface of the uncured layer. According to the method for producing the circuit substrate of the present invention, the circuit chip can be embedded inwards with high accuracy, and the circuit substrate can be produced easily with high accuracy.

4 Claims, 6 Drawing Sheets

METHOD FOR PRODUCING CIRCUIT SUBSTRATE, AND CIRCUIT SUBSTRATE

TECHNICAL FIELD

The present invention relates to a method for producing a circuit substrate whereby a circuit chip can be embedded easily with high accuracy by disposing the circuit chip on a surface thereof and then pressing the circuit chip inwards, and also relates to a circuit substrate obtained using the method for producing the circuit substrate.

BACKGROUND ART

In a circuit substrate that composes a display such as a liquid crystal display and an organic EL display, a microelectronic device for controlling each pixel of the display is disposed, and a circuit that transmits input and output signals of the microelectronic device is formed. Conventionally, in this circuit substrate, the microelectronic device is disposed by producing the device directly on a glass circuit substrate in situ. That is, the microelectronic device such as a thin film transistor (TFT) is formed by laminating an insulation film and a semiconductor film sequentially on the glass circuit substrate using a vacuum technology such as CVD (chemical vapor deposition) and then applying to these deposited films the same steps as those for producing a semiconductor integrated circuit. Such microelectronic devices are formed in the vicinity of each pixel and control on/off and contrasting density of each pixel, to realize an image formation on the display.

In recent years, the displays having a large screen of 40 to 100 inches have been desired and already commercially distributed. However, the method for producing the circuit substrate that requires a multistep process using the aforementioned glass substrate and vacuum technology is a obstacle to reduce cost. For achieving widespread use of the large screen displays, the cost must be reduced. Therefore, there has been sought a method for producing the circuit substrate whereby the cost for producing the large screen display is reduced.

Recently, a new technology has been proposed for addressing to the aforementioned demand for cost reduction of the large screen display (Patent Document 1). In the technology disclosed in this Patent Document 1, a circuit chip produced separately is used as the microelectronic device, and a plastic substrate that is inexpensive and has a light weight is used as the circuit substrate. Applying a printing technology, the circuit chip is disposed on the plastic substrate, and the circuit is produced, which enables production of a large screen display at a low cost.
Patent Document 1: JP 2003-248436-A

DISCLOSURE OF INVENTION

Problem to be Solved by the Invention

In the technology disclosed in Patent Document 1, holes for disposing the circuit chips are previously created at predetermined positions on the plastic substrate. Meanwhile, a nickel film responsive to a magnet is laminated on a surface of the circuit chip. The predetermined number of these circuit chips having the nickel film are magnetically secured in accordance with a predetermined pattern. These circuit chips are engaged in the holes on the plastic substrate at once, and then a wiring pattern is formed.

In the aforementioned conventional technology, it is necessary that the circuit chips are disposed on the plastic substrate and the holes for embedding the chips are previously created on the substrate. The embedding holes having a larger size than the size of the circuit chips would render easier disposal of the circuit chips, but would also deteriorate accuracy of the disposing position of the circuit chips on the circuit substrate. Conversely, the embedding holes having a size close to the size of the circuit chips would render high accuracy of the disposing position of the circuit chip on the substrate, but would also increase difficulty in disposal operation of the circuit chips, i.e., embedding operation of the circuit chips in the embedding holes.

The present invention has been made in the light of the above circumstance, and it is an object of the present invention to provide a method for producing a circuit substrate whereby disposal and embedding of a circuit chip can be performed easily and precisely without forming an embedding hole for the circuit chip on the substrate, and a circuit substrate obtained using such a method for producing the circuit substrate.

Means for Solving Problem

In order to solve the above problems, the present inventors have studied extensively and reached the present invention. That is, the method for producing a circuit substrate of the present invention comprises embedding a circuit chip in a circuit substrate sheet, said circuit substrate sheet including an uncured layer a part of which, said part being other than a part at which said circuit chip is disposed, is selectively curable before or after disposal of said circuit chip, and said uncured layer having a softness that enables embedding of said circuit chip in said circuit substrate sheet upon pressing said circuit chip that has been disposed on a surface of said uncured layer.

In the method for producing the circuit substrate of the present invention, it is preferable that the uncured layer that composes the circuit substrate sheet is formed to have a thickness that exceeds a thickness of the circuit chip.

A material forming the uncured layer may be any material as long as an uncured portion and a cured portion can be selectively formed, although preferable is an active energy ray-curable resin that is curable by irradiation with active energy ray, because therewith selective formation of the uncured portion and the cured portion can be performed easily and precisely.

Alternatively, the method for producing a circuit substrate of the present invention comprises: a circuit chip embedding step of providing a circuit substrate sheet having an uncured layer that is curable by irradiation with active energy ray, disposing a circuit chip on a surface of said uncured layer, and pressing said circuit chip to embed said circuit chip into said uncured layer; and a circuit substrate sheet curing step of irradiating with said active energy ray said circuit substrate sheet having said circuit chip embedded therein, to cure said circuit substrate sheet, for obtaining said circuit substrate having said circuit chip embedded therein.

In the method for producing the circuit substrate, before disposing the circuit chip on the surface of the uncured layer, an uncured portion and a cured portion may be selectively formed by bonding to the surface of the uncured layer a mask that selectively shields the active energy ray, and then irradiating the uncured layer with the active energy ray from the side on which the mask is bonded. The circuit chip may then be disposed on the surface of the uncured portion.

In the method for producing the circuit substrate, before disposing the circuit chip on the surface of the uncured layer, the uncured portion and the cured portion may be selectively formed by bonding to the uncured layer a perforated release sheet having openings selectively provided, and then irradiating the uncured layer with the active energy ray. The circuit chip may then be disposed on the surface of the uncured portion.

In the method for producing the circuit substrate of the present invention, after disposing the circuit chip on the surface of the uncured layer, the uncured portion and the cured portion may be selectively formed by irradiating the uncured layer with the active energy ray from a side of the uncured layer on which the circuit chip is disposed, and subsequently the circuit chip may be pressed on the surface of the uncured layer to embed the circuit chip into the uncured layer.

The circuit substrate of the present invention is a circuit substrate obtained by any of the aforementioned methods for producing the circuit substrate of the present invention.

EFFECT OF THE INVENTION

According to the present invention, the circuit chip is pressed inwards after the circuit chip being disposed on the surface, which renders possible to provide a method for a circuit substrate whereby the circuit chip can be embedded easily with high accuracy, and the circuit substrate produced thereby.

EXPLANATIONS OF LETTERS AND NUMERALS

Figure 1:
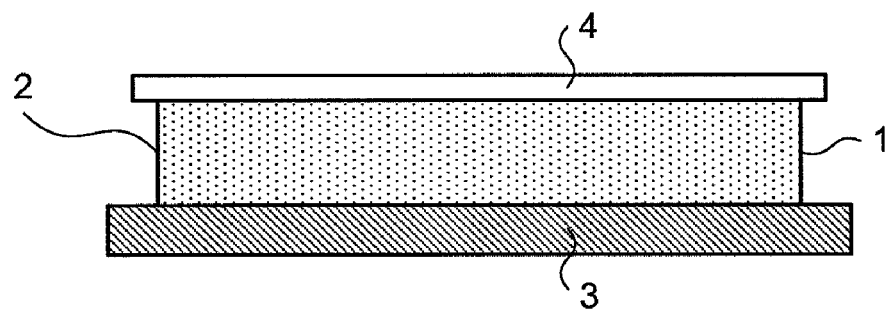
FIG. 1 is a side cross-sectional view of a circuit substrate sheet composed of an active energy ray-curable resin.

1 Circuit substrate sheet
2 Uncured layer
2a Uncured portion
2b Cured portion
3 Glass substrate
4 Release sheet of heavy-releasing type
5 Mask
6 Circuit chip
10 Plane pressing machine
11 Release sheet
12 Glass substrate
13 Circuit substrate
20 Perforated release sheet
20a Hole

BEST MODE FOR CARRYING OUT THE INVENTION

Active Energy Ray-Curable Resin

A material for a circuit substrate sheet for producing the circuit substrate of the present invention is not particularly limited as long as selective curing of the material at a part other than a part at which a circuit chip is disposed can be performed before or after disposal of the circuit chip, and pressing of the circuit chip disposed on a surface thereof can cause embedment of the circuit chip in the circuit substrate sheet, although an active energy ray-curable resin is suitably used since therewith selective formation of an uncured layer can be performed easily, and disposal and embedment of the circuit chip can be performed easily and presicely. This active energy ray-curable resin is a resin that polymerizes and cures upon irradiation with an active energy ray such as ultraviolet ray and electron beam.

Examples of the active energy ray-curable resin for use in the present invention may include (1) resins containing an acrylic polymer and an active energy ray-polymerizable oligomer and/or polymerizable monomer and, if desired, a photopolymerization initiator, and (2) resins containing an acrylic polymer having a side chain to which an active energy ray-curable functional group including a polymerizable unsaturated group is introduced, and also containing, if desired, a photopolymerization initiator.

In the resin (1), preferable examples of the acrylic polymer may include copolymers of (meth)acrylate having 1 to 20 carbon atoms in an alkyl group in its ester moiety with an optional monomer having a functional group possessing active hydrogen used and another optional monomer, i.e., (meth)acrylate copolymers.

Examples of (meth)acrylate having 1 to 20 carbon atoms in the alkyl group in its ester moiety may include methyl (meth)acrylate, ethyl (meth)acrylate, propyl (meth)acrylate, butyl (meth)acrylate, pentyl (meth)acrylate, hexyl (meth)acrylate, cyclohexyl (meth)acrylate, 2-ethylhexyl (meth)acrylate, isooctyl (meth)acrylate, palmityl (meth)acrylate and stearyl (meth)acrylate. Any one of them may be used alone or two or more thereof may be used in combination.

Meanwhile, examples of the optional monomer having a functional group possessing active hydrogen for use may include hydroxyalkyl (meth)acrylate such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate and 4-hydroxybutyl (meth)acrylate; monoalkylaminoalkyl (meth)acrylate such as monomethylaminoethyl (meth)acrylate and monoethylaminopropyl (meth)acrylate; and ethylenic unsaturated carboxylic acids such as acrylic acid, methacrylic acid, crotonic acid, maleic acid, itaconic acid and citraconic acid. Any one of these monomers may be used alone or two or more thereof may be used in combination.

In the (meth)acrylate copolymer, the amount of (meth)acrylate is 5 to 100% by weight, preferably 50 to 95% by weight, and the amount of the monomer having the functional group possessing active hydrogen is 0 to 95% by weight, preferably 5 to 50% by weight.

Examples of another optional monomer for use may include vinyl esters such as vinyl acetate and vinyl propionate; olefins such as ethylene, propylene and isobutylene; halogenated olefins such as vinyl chloride and vinylidene chloride; styrene-based monomer such as styrene and α-methylstyrene; diene-based monomer such as butadiene, isoprene and chloroprene; nitrile-based monomers such as acrylonitrile and methacrylonitrile; and acrylamides such as acrylamide, N-methylacrylamide and N,N-dimethylacrylamide. Any one of them may be used alone or two or more thereof may be used in combination. The amount of these monomers contained in the (meth)acrylate copolymer may be 0 to 30% by weight.

With the (meth)acrylate copolymer for use as the acrylic polymer in the resin, copolymerization form thereof is not particularly limited, and may be any of random, block and graft copolymerization. Its molecular weight is preferably 300,000 or more in terms of weight average molecular weight.

The aforementioned weight average molecular weight is a value in terms of polystyrene measured by a gel permeation chromatography (GPC) method.

In the present invention, one species of (meth)acrylate copolymer may be used alone. Alternatively, two or more thereof may be used in combination.

Examples of the active energy ray-polymerizable oligomer may include polyester acrylate-based oligomers, epoxy acrylate-based oligomers, urethane acrylate-based oligomers, polyether acrylate-based oligomers, polybutadiene acrylate-based oligomers and silicone acrylate-based oligomers.

The weight average molecular weight of the polymerizable oligomer is selected in the range of preferably 500 to 100,000, more preferably 1,000 to 70,000 and still more preferably 3,000 to 40,000 as the value in terms of standard polystyrene measured by the GPC method.

On species of polymerizable oligomer may be used alone. Alternatively, two or more thereof may be used in combination.

Meanwhile, examples of the active energy ray-polymerizable monomer may include monofunctional acrylates such as cyclohexyl (meth)acrylate, 2-ethylhexyl (meth)acrylate, morpholine (meth)acrylate and isobonyl (meth)acrylate; 1,4-butanediol di(meth)acrylate, 1,6-hexanediol di(meth)acrylate, neopentyl glycol di(meth)acrylate, polyethylene glycol di(meth)acrylate, neopentyl glycol adipate di(meth)acrylate, neopentyl glycol hydroxypivalate di(meth)acrylate, dicyclopentanyl di(meth)acrylate, caprolactone-modified dicyclopentenyl di(meth)acrylate, ethyleneoxide-modified phosphate di(meth)acrylate, allylated cyclohexyl di(meth)acrylate, isocyanurate di(meth)acrylate, trimethylolpropane tri(meth)acrylate, dipentaerythritol tri(meth)acrylate, pentaerythritol tri(meth)acrylate, propylene oxide-modified trimethylolpropane tri(meth)acrylate, tris(acryloxyethyl) isocyanurate, propionic acid-modified dipentaerythritol penta (meth)acrylate, dipentaerythritol hexa(meth)acrylate and caprolactone-modified dipentaerythritol hexa(meth)acrylate. Any one of these polymerizable monomers may be used alone or two or more thereof may be used in combination.

The amount of these polymerizable oligomers and polymerizable monomers to be used may usually be 3 to 500 parts by weight based on 100 parts by weight of a solid content in the (meth)acrylate copolymer.

As the active energy ray, an ultraviolet ray or an electron beam is usually used, and when the ultraviolet ray is used, a photopolymerization initiator is used. Examples of this photopolymerization initiator may include benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-1,2-diphenylethane-1-one, 2,2-dimethoxy-2-phenylacetophenone, 2,2-diethoxy-2-phenylacetophenone, 2-hydroxy-2-methyl-1-phenylpropane-1-one, 1-hydroxycyclohexyl phenyl ketone, 2-methyl-1-[4-(methylthio)phenyl]-2-morpholinopropane-1-one, 4-(2-hydroxyethoxy)phenyl-2(hydroxy-2-propyl) ketone, benzophenone, p-phenylbenzophenone, 4,4'-diethylaminobenzophenone, dicyclobenzophenone, 2-methylanthraquinone, 2-ethylanthraquinone, 2-tertiary-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyl dimethyl ketal, acetophenone dimethyl ketal, acetophenone dimethyl ketal, p-dimethylamine benzoate and oligo(2-hydroxy-2-methyl-1-[4-(1-propenyl)phenyl]propanone). Any one of them may be used alone or two or more thereof may be used in combination.

The amount of such a polymerization initiator to be blended is usually 0.1 to 10 parts by weight based on 100 parts by weight of the solid content in the aforementioned active energy ray-curable resin.

Subsequently, examples of the acrylic polymer having a side chain to which an active energy ray-curable functional group including a polymerizable unsaturated group is introduced may include those obtained by preparing the aforementioned (meth)acrylate polymer having a side chain to which an active point such as —COOH, —NCO, epoxy group, —OH or —NH$_2$ is introduced, and then reacting this active point with a compound having the polymerizable unsaturated group, to thereby introduce the energy ray-curable functional group having the polymerizable unsaturated group into the side chain of the acrylic polymer.

In order to introduce the active point into the acrylic polymer, a monomer or an oligomer having the functional group such as —COOH, —NCO, epoxy group, —OH or —NH$_2$ and the polymerizable unsaturated group may be allowed to coexist in a reaction system when the acrylic polymer is produced. Specifically, upon producing the acrylic polymer in accordance with the aforementioned description about the resin (1), (meth)acrylic acid, etc. may be used for introducing —COOH, 2-(meth)acryloyloxyethyl isocyanate, etc. may be used for introducing —NCO, glycidyl (meth)acrylate, etc. may be used for introducing epoxy group, 2-hydroxyethyl (meth)acrylate or 1,6-hexanediol mono(meth)acrylate, etc. may be used for introducing —OH, and N-methyl (meth)acrylamide, etc. may be used for introducing —NH$_2$.

The compound having the polymerizable unsaturated group for the reaction with the active point may be appropriately selected among, for example, 2-(meth)acryloyloxyethyl isocyanate, glycidyl (meth)acrylate, pentaerythritol mono (meth)acrylate, dipentaerythritol mono (meth)acrylate, dipentaerythritol mono (meth)acrylate, trimethylolpropane mono(meth)acrylate, depending on the type of the active point.

In this way, it is possible to obtain the acrylic polymer, i.e. the (meth)acrylate copolymer, wherein the active energy ray-curable functional group including the polymerizable unsaturated group is introduced to the side chain of the acrylic polymer through the active point.

This (meth)acrylate copolymer to which the active energy ray-curable functional group has been introduced has a weight average molecular weight of preferably 100,000 or more and particularly preferably 300,000 or more. The weight average molecular weight is the value in terms of polystyrene measured by the GPC method.

As the optionally used photopolymerization initiator, the photopolymerization initiators exemplified in the description of the aforementioned resin (1) may be used.

If desired, to the aforementioned active energy ray-curable resins (1) and (2), it is possible to add crosslinking agents, tackifiers, antioxidants, ultraviolet ray absorbers, light stabilizers, softeners and fillers, within the range in which the effects of the present invention are not impaired.

Examples of the crosslinking agents may include polyisocyanate compounds, epoxy resins, melamine resins, urea resins, dialdehydes, methylol polymers, aziridine-based compounds, metal chelate compounds, metal alkoxide and metal salts, and the polyisocyanate compound is preferably used. This crosslinking agent can be added at 0 to 30 parts by weight based on 100 parts by weight of the solid content in the aforementioned (meth)acrylate copolymer.

Examples of the polyisocyanate compound may include aromatic polyisocyanate such as tolylene diisocyanate, diphenylmethane diisocyanate and xylylene diisocyanate; aliphatic polyisocyanate such as hexamethylene diisocyanate; alicyclic polyisocyanate such as isophorone diisocyanate and hydrogenated diphenylmethane diisocyanate; as well as biuret and isocyanurate thereof, and further adducts thereof which are reactants with a low molecular active hydrogen-containing compound such as ethylene glycol, neopentyl glycol, trimethylol propane and castor oil. Any one of these crosslinking agents may be used alone, or two or more thereof may be used in combination.

Concerning the aforementioned active energy ray-curable resins (1) and (2), the energy ray-curable resin may contain the (meth)acrylate copolymer of (2) having the side chain including the polymerizable, unsaturated, active energy ray-curable group. Likewise, the active energy ray-curable resin (2) may contain the acrylic polymer, the active energy ray-polymerizable oligomer or the active energy ray-polymerizable monomer of (1). If desired, a solvent may also be added. The solvent to be used may be appropriately selected among publicly known solvents that exhibit a good solubility with the active energy ray-curable resins (1) and (2) and are inactive with the resins (1) and (2). Examples of such a solvent may include toluene, xylene, methanol, ethanol, isobutanol, n-butanol, acetone, methyl ethyl ketone, tetrahydrofuran and ethyl acetate. Any one of them may be used alone or two or more thereof may be used in combination.

Among the active energy rays, the ultraviolet ray may be preferably used in terms of versatility and economical efficiency. As a lamp that generates the ultraviolet ray, a high pressure mercury lamp, a metal hydride lamp, a xenon lamp and an electrodeless ultraviolet ray lamp are available. The irradiation amount of the ultraviolet ray is appropriately selected. For example, the light amount is 1 to 1,500 mJ/cm$^2$ and the illuminance is about 10 to 500 mW/cm$^2$.

The circuit substrate sheet for use in the present invention may be formed with the active energy ray-curable resin in accordance with the following procedures.

(Formation of Circuit Substrate Sheet)

A coating solution of the active energy ray-curable resin is prepared. This coating solution is applied onto a release treated side of a release sheet (release sheet of heavy-releasing type) which has a base for release sheet and a releasing agent layer provided on one side thereof.

If the solution includes a solvent, heating and drying is then performed. Thereby a sheet on which an uncured layer composed of the active energy ray-curable resin has been formed is obtained. The coating solution is applied using a knife coater, a roll coater, a bar coater, a blade coater or a gravure coater, and dried under conditions of room temperature to 150° C., preferably 60 to 130° C. for 1 to 10 minutes. As the release sheet, those publicly known may be used, and examples thereof may include those having a base for release sheet such as a polyethylene film, a polypropylene film, polyethylene terephthalate film or a polyethylene naphthalate film and a releasing agent layer provided thereon by applying a releasing agent such as a silicone resin, an alkyd resin or a long chain alkyl resin. The thickness of this release sheet is usually about 20 to 150 μm.

Likewise, the aforementioned coating solution is separately applied onto the release treated side of another release sheet (release sheet of light-release type) which has a base for release sheet and a releasing agent layer provided on one side thereof. Heating and drying is then performed if necessary. Thereby another sheet having an uncured layer composed of the active energy ray-curable resin is obtained. The release force of the release sheet used herein is set to be smaller than the that of the release sheet of heavy-releasing type.

The uncured layer on the release sheet of light-release type is laminated on the uncured layer on the release sheet of heavy-releasing type, and the release sheet of light-release type is peeled. This lamination step is repeated, to thereby obtain a circuit substrate sheet having an uncured layer of a predetermined thickness that is composed of the active energy ray-curable resin sandwiched with the release sheet of heavy-releasing type and the release sheet of light-release type. The thickness of the uncured layer is 30 to 1,000 μm and preferably 50 to 500 μm.

The uncured layer composed of the active energy ray-curable resin is in an uncured state until being irradiated with the active energy ray, and the resin in the uncured state has a softness that enables embedding of the circuit chip. Therefore, if a desired number of the circuit chips are disposed on this uncured layer by any arbitrary method and subsequently these circuit chips are vertically pressed onto the surface of the uncured layer using, e.g., a plane pressing machine, then the circuit chips can be embedded in the uncured layer. After embedding the circuit chips, entire irradiation of the uncured layer with the active energy ray would cause curing of the uncured layer, whereby the circuit chips are firmly fixed and a sufficient physical strength as the circuit substrate is realized.

Selective formation of the uncured portion and the cured portion may be performed before or after disposing the circuit chips on the uncured layer.

To leave uncured the region on which the circuit chip are to be disposed and circumferences thereof in the depth direction while curing other regions before disposing the circuit chips on the uncured layer, there are mainly two methods. In one method, a mask for selectively shielding the active energy ray is bonded on the surface of the uncured layer, and the side on which the mask has been bonded is irradiated with the active energy ray, whereby the irradiated portion is cured and the non-irradiated portion shielded by the mask is left uncured. Examples of the mask for shielding the active energy ray may include those having a base plate made of, e.g., a quartz glass and a metal thin film of, e.g., chromium formed thereon as a shielding portion. The other method utilizes a phenomenon inhibiting curing of an active energy ray-curable resin whose curing process proceeds by radical polymerization, wherein the phenomenon occurs when the resin is in contact with an oxygen-containing atmosphere such as an air. That is, a release sheet through which the active energy ray can pass is selectively perforated to obtain a perforated release sheet, which is then placed on the uncured layer and they are irradiated with the active energy ray. Although the active energy ray is given to the entire surface of the cured layer, the portion covered with the sheet and therefore not contacted with oxygen is cured, whereas the portion contacted with the oxygen-containing atmosphere through the holes is left uncured as a result of oxygen's inhibition of curing. This method utilizes this phenomenon for selectively creating the uncured portion. It is preferable that the side of the uncured layer on which the perforated release sheet is not bonded is attached to, e.g., a glass substrate for avoiding contact with the oxygen-containing atmosphere. For the perforated release sheet, the aforementioned release sheet may be used. The hole can be created by any publicly known method such as a method with a heated needle or a laser. The thickness of the perforated release sheet is usually about 20 to 150 μm.

To leave uncured the region on which the circuit chip has disposed and circumferences thereof in the depth direction while curing other regions after disposing the circuit chips on the uncured layer, the irradiation with the active energy ray may be performed using the circuit chip as the mask. That is, after disposing the circuit chips on the surface of the uncured layer, the uncured layer is irradiated with the active energy ray from above the surface of the uncured layer on which the circuit chips have been disposed. By this irradiation, the uncured portion and the cured portion are selectively formed using the circuit chips as the masks. Subsequently, the circuit chips are pressed to embed the circuit chips in the uncured layer.

The method for producing the circuit substrate using each of the aforementioned embedding method will be described hereinbelow with reference to the figures.

(Method for Producing Circuit Substrate (1))

Referring to FIG. 1, a release sheet of light-release type (not shown in the figure) on a circuit substrate sheet 1 produced as described above is peeled from an uncured layer 2 and the circuit substrate sheet is bonded to a glass substrate 3 such as a soda lime or a quartz glass. At that time, a release sheet of heavy-releasing type 4 which is capable of passing the active energy ray therethrough is left unpeeled.

Figure 2:
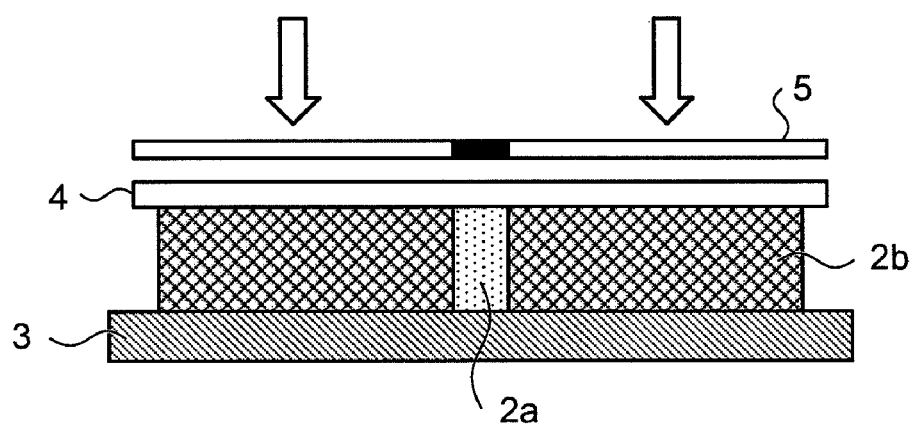
FIG. 2 is a side cross-sectional view of a state wherein the circuit substrate sheet is irradiated with an active energy ray through a mask to selectively form an uncured portion.

As shown in FIG. 2, a mask 5 having a predetermined number (one in the figure) of parts which shields the active energy ray in a form of a predetermined pattern is bonded on the release sheet of heavy-releasing type 4, and irradiation with the active energy ray is performed onto the side on which the mask has been bonded. As the mask, the one having a quartz glass and a thin film of chromium thereon at a part for shielding the active energy ray can be used.

Figure 3:
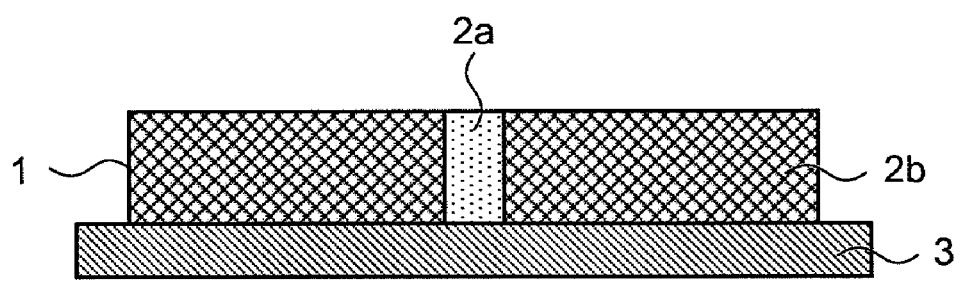
FIG. 3 is a side cross-sectional view of the circuit substrate sheet in a state wherein the uncured portion and the cured portion are exposed.

As a result of being irradiated with the active energy ray, the part shielded from the irradiation of the active energy ray by the mask 5 is left as an uncured portion 2*a*, and the remaining portion irradiated with the active energy ray becomes a cured portion 2*b*. Subsequently, as shown in FIG. 3, the release sheet of heavy-releasing type 4 on the other side is peeled to expose the uncured portion 2*a* and the cured portion 2*b*.

Figure 4:
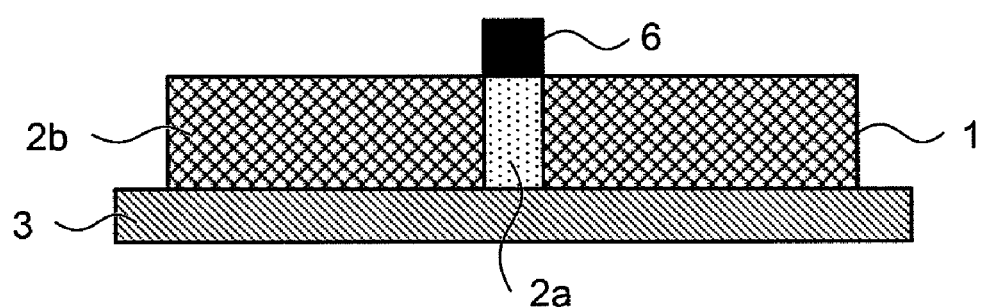
FIG. 4 is a side cross-sectional view of a state wherein a circuit chip is disposed on the circuit substrate sheet.

Subsequently, as shown in FIG. 4, the predetermined number (one in the figure) of the circuit chips 6 is disposed by any arbitrary method on the surface of the uncured portion 2*a* of the circuit substrate sheet.

Figure 5:
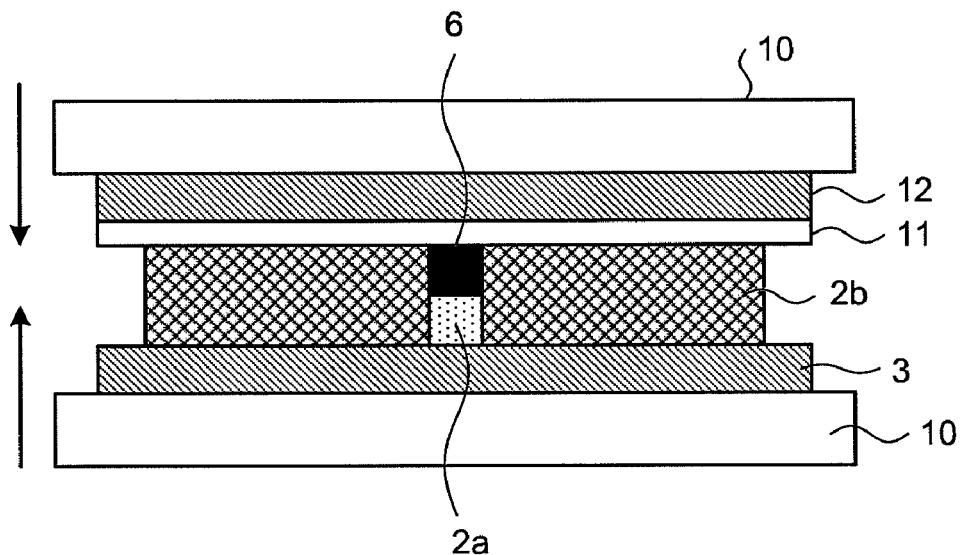
FIG. 5 is a side cross-sectional view of a state wherein the circuit chip disposed on a surface of the circuit substrate sheet is embedded into the circuit substrate sheet by a plane pressing machine.

The circuit substrate sheet 1 on which the predetermined number (one in the figure) of the circuit chips 6 has been disposed at the predetermined position is mounted together with the glass substrate 3 in a plane pressing machine 10 as shown in FIG. 5. Subsequently, a release sheet 11 and a glass substrate 12 are placed sequentially on the circuit substrate sheet 1, and they are gradually pressed from above and below. As the release sheet 11 and the glass substrate 12, those enumerated previously may be used. Then, the circuit chip 6 disposed on the surface is embedded in the circuit substrate sheet 1 because the uncured portion on which the circuit chip 6 has been disposed is uncured and soft. The surface of the circuit chip and the surface of the circuit substrate sheet 1 thereby compose continuous plane. At that time, pressure is evenly applied to the circuit substrate sheet 1 by the lower glass substrate 3, the upper glass substrate 12 and release sheet 11, whereby a flatness of the surface is not impaired even after the circuit chip 6 is embedded. The depth direction along which the circuit chip 6 is embedded is controlled by the surrounding cured portion 2*b*, whereby the circuit chip 6 is embedded in the sheet without causing displacement in a horizontal direction to the sheet surface.

Figure 6:
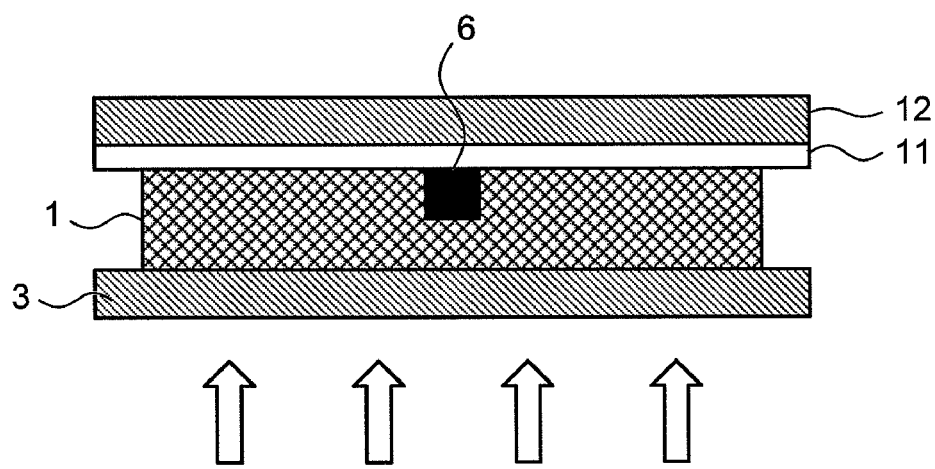
FIG. 6 is a side cross-sectional view showing a state wherein the circuit substrate sheet in which the circuit chip has been embedded is irradiated with an active energy ray for curing.
Figure 7:
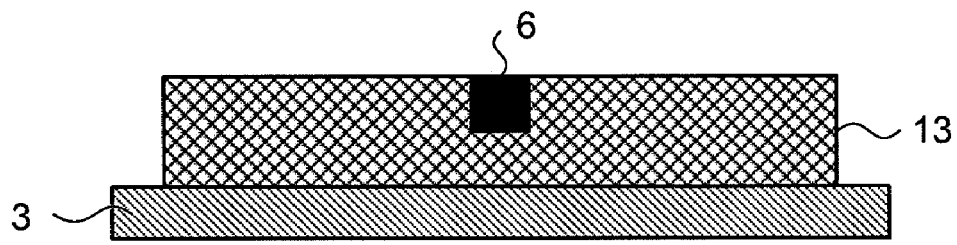
FIG. 7 is a side cross-sectional view of the circuit substrate obtained by completing embedding of the circuit chip and curing of the circuit substrate sheet.

After the circuit chip 6 is embedded, the circuit substrate sheet is unloaded from the plane pressing machine 10 as the upper release sheet 11 and glass substrate 12 and the lower glass substrate 3 are kept attached. Subsequently, as shown in FIG. 6, the entire surface of the circuit substrate sheet 1 is irradiated with the active energy ray from the side of the lower glass substrate 3 to cure the uncured portion 2*a* of the circuit substrate sheet 1. After curing, the upper glass substrate 12 and release sheet 11 are removed, to obtain a circuit substrate 13 wherein the entire circuit substrate sheet has been cured after embedding the desired circuit chip 6.

Subsequently, the circuit substrate 13 is furnished with wirings for controlling the pixels by well-known electrode and wiring formation methods such as vacuum deposition, sputtering and photolithography, to complete the circuit substrate for the display.

In the method for producing the circuit substrate aforementioned with reference to FIGS. 1 to 7, the uncured portion 2*a* and the cured portion 2*b* are formed using the mask 5. Alternatively in the present invention, it is also possible to selectively form an uncured adhesive portion by bringing a predetermined local area into contact with oxygen upon being irradiated with the active energy ray to cause inhibition against curing. This method will be described hereinbelow with reference to FIGS. 8 to 10.

(Method for Producing Circuit Substrate (2))

Figure 8:
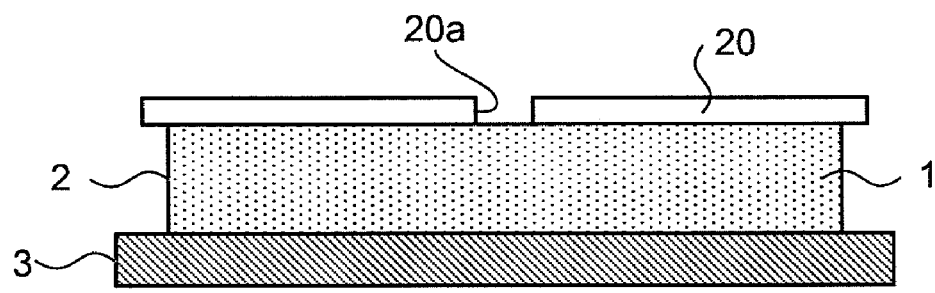
FIG. 8 is a side cross-sectional view of a state wherein a perforated release sheet is cohered to an exposed side of the circuit substrate sheet composed of the active energy ray-curable resin.

Referring to FIG. 8, the release sheet of light-release type (not shown in the figure) on the circuit substrate sheet 1 produced as described previously is peeled from the uncured layer 2, and the circuit substrate sheet is bonded to the glass substrate 3. Subsequently, the release sheet of heavy-releasing type on the other side (not shown in the figure) is peeled, and instead thereof, a perforated release sheet 20 is bonded. This perforated release sheet 20 has a predetermined number (one in the figure) of holes 20*a* formed in a predetermined pattern.

Figure 9:
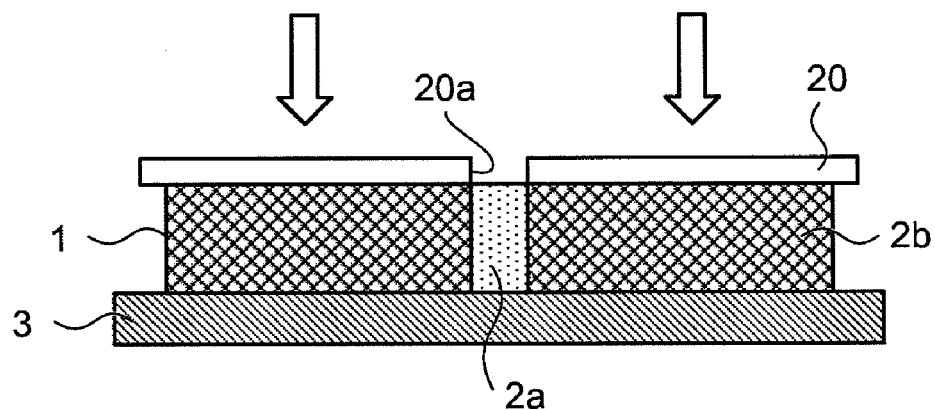
FIG. 9 is a side cross-sectional view of a state of selectively forming an uncured portion and a cured portion by irradiating the circuit substrate sheet with an active energy ray through the perforated release sheet under an oxygen-containing atmosphere.

Subsequently as shown in FIG. 9, irradiation with the active energy ray is performed onto the side on which the perforated release sheet 20 has been bonded toward the uncured layer 2. As mentioned in the above, the hole 20a has been created in the perforated release sheet 20, and thus, the uncured layer 2 in the region of the hole 20a is in contact with air. Keeping this state, the uncured layer 2 is irradiated with the active energy ray under the atmosphere such as air containing oxygen, whereby the entire region of the uncured layer 2 is photocured, except for the region in contact with the air through the hole 20a in which curing does not occur because curing is inhibited by oxygen in the air. Thus, the uncured portion 2a is selectively formed, and the remaining portion becomes the cured portion 2b. In FIG. 9, irradiation with the active energy ray is performed onto the side on which the perforated release sheet 20 has been bonded, but may also be performed onto the side of the glass substrate 3.

Figure 10:
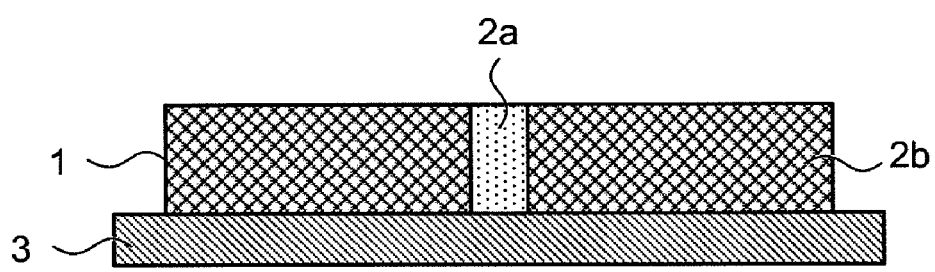
FIG. 10 is a side cross-sectional view of the circuit substrate sheet in a state wherein the uncured portion and the cured portion are exposed.

As mentioned in the above, the uncured portion 2a and the cured portion 2b are selectively formed as a result of the irradiation using the perforated release sheet 20 under the atmosphere such as air containing oxygen. Subsequently, the perforated release sheet 20 is peeled to expose the uncured portion 2a and the cured portion 2b as shown in FIG. 10. Subsequently, the circuit substrate 13 is obtained in accordance with the steps shown in aforementioned FIGS. 4 to 7.

In the aforementioned methods for producing the circuit substrate (1) and (2), the uncured portion 2a and the cured portion 2b are formed before the circuit chip 6 is disposed on the uncured layer 2. Alternatively, in the present invention, it is also possible to form the uncured portion 2a and the cured portion 2b after disposing the circuit chip 6 on the uncured layer 2. This method will be described hereinbelow with reference to FIGS. 11 and 12.

(Method for Producing Circuit Substrate (3))

Figure 11:
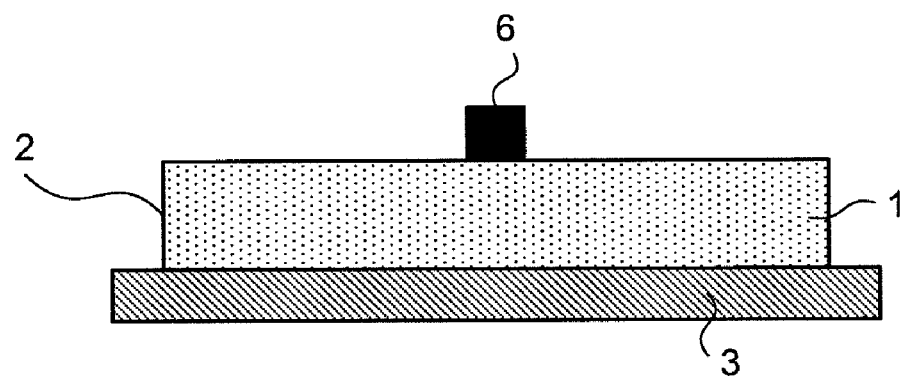
FIG. 11 is a side cross-sectional view showing a state wherein a circuit chip is disposed on the uncured layer of the circuit substrate sheet.

Referring to FIG. 11, the release sheet of light-release type (not shown in the figure) of the circuit substrate sheet 1 produced as described previously is peeled from the uncured layer 2, and the circuit substrate sheet is bonded to the glass substrate 3. Subsequently, the release sheet of heavy-releasing type (not shown in the figure) is peeled, and the predetermined number (one in the figure) of the circuit chips 6 is disposed in the predetermined pattern on the exposed uncured layer 2.

Figure 12:
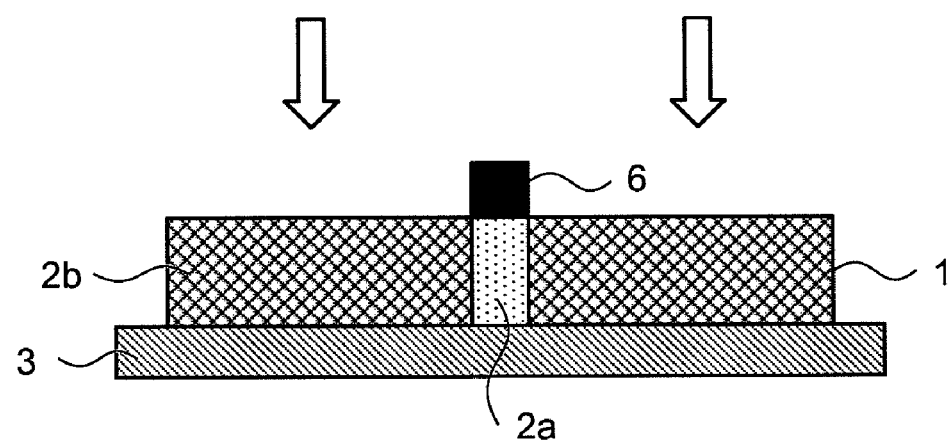
FIG. 12 is a side cross-sectional view showing a state wherein the uncured portion and the cured portion are selectively formed by irradiation with an active energy ray using the circuit chip on the uncured layer of the circuit substrate sheet as a mask.

Subsequently, as shown in FIG. 12, irradiation with the active energy ray is performed toward the uncured layer 2 onto the side thereon on which the circuit chip has been disposed. As a result, the circuit chip 6 serves as a mask, and the portion under the circuit chip 6 becomes the uncured portion 2a. The remaining portion becomes the cured portion 2b. Subsequently, the circuit substrate 13 is obtained in accordance with the steps shown in aforementioned FIGS. 4 to 7.

EXAMPLES

Examples of the method for producing the circuit substrate of the present invention will be discussed hereinbelow. The Examples shown below are only exemplifications for suitably explaining the present invention, and by no means limit the present invention.

Examples 1 and 2 to be discussed hereinbelow are examples which were performed in accordance with the method for producing the circuit substrate (1) previously described with reference to FIGS. 1 to 7. Likewise, Example 3 is an example which was performed in accordance with the method for producing the circuit substrate (2) previously described with reference to FIGS. 8 to 10, and Example 4 is an example which was performed in accordance with the method for producing the circuit substrate (3) previously described with reference to FIGS. 11 and 12.

Example 1

Formation of Circuit Substrate Sheet 80 parts by weight of butyl acrylate (supplied from Kanto Chemical Co., Inc.) and 20 parts by weight of acrylic acid (supplied from Kanto Chemical Co., Inc.) were reacted in a mixed solvent of ethyl acetate/methyl ethyl ketone (weight ratio: 50:50), to obtain an acrylate copolymer (solid content: 35% by weight), to which 2-methacryloyloxyethyl isocyanate (supplied from Kokusan Chemical Co., Ltd.) was added so that the amount thereof was 30 equivalents per 100 equivalents of acrylic acid in the copolymer. The mixture was reacted under a nitrogen atmosphere at 40° C. for 48 hours to yield an acrylic copolymer having a weight average molecular weight of 850,000 and having a side chain to which an active energy ray-curable functional group including an active energy ray-curable group.

To 100 parts by weight in terms of solid content of the resulting acrylic copolymer solution to which the active energy ray-curable functional group is introduced, were dissolved 3.0 Parts by weight of 2,2-dimethoxy-1,2-diphenylethane-1-one (brand name: Irgacure 651 supplied from Ciba Specialty Chemicals) as a photopolymerization initiator, 100 parts by weight (solid content: 80 parts by weight) of a composition composed of active energy ray-polymerizable polyfunctional monomer and oligomer (brand name: 14-29B (NPI) supplied from Dainichiseika Color & Chemicals Mfg. Co., Ltd.) and 1.2 parts by weight (solid content: 0.45 parts) of a crosslinking agent composed of a polyisocyanate compound (brand name: Oriban BHS-8515 supplied from Toyo Ink Mfg. Co., Ltd.) were dissolved. Finally, methyl ethyl ketone was added thereto for adjusting the solid content concentration to 40% by weight, and the mixture was stirred until an even solution was obtained, to obtain a coating solution.

The coating solution thus prepared was applied using a knife coater onto a release treated side of a release sheet of heavy-releasing type (brand name: SP-PET3811 supplied from LINTEC Corporation) which has a polyethylene terephthalate film having a thickness of 38 μm and a silicone-based releasing agent layer provided on one side of that film. The layers were heated and dried at 90° C. for 90 seconds to form an uncured layer composed of the active energy ray-curable resin having a thickness of 50 μm.

Likewise, the coating solution was separately applied onto the release treated side of a release sheet of light-release type (brand name: SP-PET3801 supplied from LINTEC Corporation) which has a polyethylene terephthalate film having a thickness of 38 μm and a silicone-based releasing agent layer provided on one side of that film. The layers were heated and dried at 90° C. for 90 seconds to form an uncured layer composed of the active energy ray-curable resin having the thickness of 50 μm.

The uncured layer on the release sheet of light-release type was laminated on the uncured layer on the release sheet of heavy-releasing type, and the release sheet of light-release type was peeled therefrom. This lamination process was repeated, to thereby obtain a circuit substrate sheet having an uncured layer composed of the active energy ray-curable resin and having the thickness of 400 μm, sandwiched with the release sheet of heavy-releasing type and the release sheet of light-release type.

(Selective Formation of Uncured Portion and Cured Portion)

The release sheet of light-release type on the circuit substrate sheet having the uncured layer was peeled, and the circuit substrate sheet was bonded to a soda lime glass substrate of 5 cm×5 cm. Keeping this state, on the release sheet of heavy-releasing type at the other side, a mask was bonded. Via this mask, the circuit substrate sheet was irradiated with ultraviolet ray under conditions of an illuminance of 400 mW/cm$^2$ and a light amount of 315 mJ/cm$^2$ using an electrodeless lamp (H bulb, supplied from Fusion Inc.) as a light source. As the mask, a mask having a quartz glass and a thin film of chromium formed on the glass for shielding the ultraviolet ray (size of shielding part: lengthwise 520 μm×crosswise 520 μm, interval 1740 μm) was used. By being irradiated with the ultraviolet ray from above the mask, four uncured portions having the size of lengthwise 520 μm×crosswise 520 μm were formed in the uncured layer, and the remaining portion was cured.

(Embedding of Circuit Chip in Circuit Substrate Sheet)

The release sheet of heavy-releasing type of the circuit substrate sheet was peeled, and each of four circuit chips (lengthwise 500 μm×crosswise 500 μm and thickness 200 μm) was disposed on the surface of each of the four uncured portions.

(Embedding of Circuit Chips, and Curing of Circuit Substrate Sheet)

On the circuit substrate sheet on which the circuit chips had been disposed on the glass substrate, a separately prepared soda lime glass plate of 5 cm×5 cm as another glass substrate was thrusted via a release sheet (brand name: SP-PET3801 supplied from LINTEC Corporation). They were pressed at a pressure of 0.3 MPa for 5 minutes using a plane pressing machine. After restoring a normal pressure, the circuit substrate sheet together with the release sheet, the upper soda lime glass and the lower glass substrate was removed from the plane pressing machine. The circuit substrate sheet was irradiated with ultraviolet ray under conditions of an illuminance of 400 mW/cm$^2$ and a light amount of 315 mJ/cm$^2$ using an electrodeless lamp (H bulb, supplied from Fusion Inc.) as a light source. The irradiation was performed from the lower glass substrate side having no circuit chip, to thereby cure the uncured portion. Subsequently, the soda lime glass plate and the release sheet on the upper side of the circuit substrate sheet were removed, to thereby obtain a circuit substrate on the lower soda lime glass substrate in which the four circuit chips had been embedded at a desired position.

Example 2

The embedment of the circuit chips in the circuit substrate sheet and the curing of the circuit substrate sheet were performed in the same manner as in Example 1, except that a mask on which a shielding part having a size of lengthwise 800 μm×crosswise 800 μm (interval 1740 μm) had been formed was used as the mask that shielded the ultraviolet ray to the circuit substrate sheet, to thereby obtain a circuit substrate.

Example 3

A circuit substrate was obtained in the same manner as in Example 1, except that the step of selectively forming the uncured portion and the cured portion in the circuit substrate sheet in Example 1 was changed as follows.

(Selective Formation of Uncured Portion and Cured Portion)

The release sheet of light-release type on the circuit substrate sheet having the uncured layer was peeled, and the circuit substrate sheet was bonded onto the soda lime glass substrate of 5 cm×5 cm.

Subsequently, a release sheet (brand name: SP-PET3801 supplied from LINTEC Corporation) having a polyethylene terephthalate film having a thickness of 38 μm and a silicone-based releasing agent layer provided on one side of that film was prepared. The release sheet was subjected to application of a carbon dioxide laser, to create square holes of 520 μm×520 μm (interval 1740 μm) in the regions corresponding to four places for disposing the circuit chips (perforated release sheet).

The perforated release sheet obtained by the aforementioned procedure was bonded on a surface of the uncured layer which had been exposed by peeling the release sheet of heavy-releasing type of the circuit substrate sheet. Keeping this state, the uncured layer of the circuit substrate sheet was irradiated with ultraviolet ray onto the side of the perforated release sheet under an air atmosphere (oxygen gas-containing atmosphere). The irradiation was performed under conditions of an illuminance of 400 mW/cm$^2$ and a light amount of 100 mJ/cm$^2$ using an electrodeless lamp (H bulb, supplied from Fusion Inc.) as the light source. As a result, four parts of uncured portions each having a size of lengthwise 520 μm×crosswise 520 μm were formed on the uncured layer, and the remaining portion became a cured portion. Subsequently, circuit chips were embedded in the circuit substrate sheet and the circuit substrate sheet was cured, to obtain a circuit substrate in the same manner as in Example 1.

Example 4

A circuit substrate was obtained in the same manner as in Example 1, except that the process before embedding the circuit chip in Example 1 was changed as follows.

(Selective Formation of Uncured Portion and Cured Portion)

The release sheet of light-release type on the circuit substrate sheet having the uncured layer was peeled, and the exposed uncured layer was bonded onto the soda lime glass substrate of 5 cm×5 cm. The release sheet of heavy-releasing type on the surface at the other side was then peeled to expose the uncured layer.

Subsequently, four circuit chips were disposed in a predetermined pattern on the uncured layer. Keeping this state, the uncured layer of the circuit substrate sheet was irradiated with ultraviolet ray from right above onto the side on which the circuit chips had been disposed. Irradiation was performed under conditions of an illuminance of 400 mW/cm$^2$ and a light amount of 600 mJ/cm$^2$ using the electrodeless lamp (H bulb, supplied from Fusion Inc.) as a light source. As a result, uncured portions having almost the same size as the circuit chip size (lengthwise 500 μm×crosswise 500 μm) were formed in the uncured layer under the circuit chips, and the remaining portion became a cured portion. Subsequently, embedment of the circuit chips in the circuit substrate sheet and curing of the circuit substrate sheet was performed in the same manner as in Example 1, to obtain a circuit substrate.

Reference Example 1

A circuit substrate was obtained in the same manner as in Example 1, except that the circuit substrate sheet was not irradiated with the ultraviolet ray to leave the entire region as an uncured adhesive resion before disposing the circuit chips.

Reference Example 2

A circuit substrate was obtained in the same manner as in Example 1, except that the size of the shielding portion in the mask used was changed to lengthwise 1300 μm×crosswise 1300 μm (interval 1740 μm).

(Evaluation)

The surface size of the uncured portion, and the displacement width (μm) in a horizontal direction between the position of circuit chip at the beginning of embedding and the position of the circuit chip at the completion of embedding were measured as to each Example. The evaluation test was performed 10 times, and a mean value thereof was calculated. The results were shown in Table 1.

TABLE 1

|  | Surface size of the uncured portion (lengthwise μm × crosswise μm) | Position displacement width of the circuit chip before and after embedment (μm) |
| --- | --- | --- |
| Example 1 | 520 × 520 | 9 |
| Example 2 | 800 × 800 | 18 |
| Example 3 | 520 × 520 | 9 |
| Example 4 | 500 × 500 | 0 |
| Comparative Example 1 | Entire area of the uncured layer | 814 |
| Comparative Example 2 | 1300 × 1300 | 52 |

As is evident from Table 1, the method for producing the circuit substrate of the present invention enables easy and precise embedment and securing of a circuit chip on a circuit substrate sheet with a small displacement distance. The method for producing the circuit substrate of the present invention enables easy production of a circuit substrate in which a circuit chip has been embedded precisely.

INDUSTRIAL APPLICABILITY

As described above, according to the present invention, it is possible to provide a method for producing a circuit substrate wherein a circuit chip is disposed on a surface and then pressed inwards, whereby embedment can be performed easily with high precision, as well as a circuit substrate produced thereby.

The invention claimed is:

1. A method for producing a circuit substrate comprising:
    providing a circuit substrate sheet having an uncured layer that is curable by irradiation with active energy ray;
    disposing a circuit chip on a predetermined part of said uncured layer;
    thereafter embedding said circuit chip into said uncured layer; and
    irradiating with said active energy ray said circuit substrate sheet having said circuit chip embedded therein, to cure said circuit substrate sheet, for obtaining said circuit substrate having said circuit chip embedded therein, wherein:
    before embedding said circuit chip into said uncured layer, a part, that is other than said predetermined part, of said uncured layer is selectively cured to be a cured portion, whereas said predetermined part is left to be an uncured portion.

2. The method for producing the circuit substrate according to claim 1, wherein, before disposing the circuit chip on the surface of said uncured layer, said selective formation of said uncured portion and said cured portion is performed by bonding to the surface of said uncured layer a mask for selectively shielding the active energy ray and irradiating said uncured layer with the active energy ray from a side of said bonded mask, followed by said disposal of the circuit chip on the surface of said uncured portion, and pressing of the circuit chip for said embedment of said circuit chip in said uncured layer.

3. The method for producing the circuit substrate according to claim 1, wherein, before disposing the circuit chip on the surface of said uncured layer, said selective formation of said uncured portion and said cured portion is performed by bonding on said uncured layer a perforated having holes selectively provided and irradiating said uncured layer with the active energy ray, followed by said disposal of the circuit chip on the surface of said uncured portion, and pressing of the circuit chip for said embedment of said circuit chip in said uncured layer.

4. The method for producing the circuit substrate according to claim 1, wherein, after disposing the circuit chip on the surface of said uncured layer, said selective formation of said uncured portion and said cured portion is performed by irradiating said uncured layer with the active energy ray from a side of the disposed circuit chip on said uncured layer, followed by pressing of said circuit chip for said embedment of said circuit chip in said uncured layer.

* * * * *